(12) United States Patent
Ma et al.

(10) Patent No.: US 7,218,188 B2
(45) Date of Patent: *May 15, 2007

(54) MICROELECTROMECHANICAL APPARATUS AND METHODS FOR SURFACE ACOUSTIC WAVE SWITCHING

(75) Inventors: Qing Ma, San Jose, CA (US); Dong S. Shim, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 166 days.

This patent is subject to a terminal disclaimer.

(21) Appl. No.: 11/037,307

(22) Filed: Jan. 18, 2005

(65) Prior Publication Data

US 2005/0122001 A1   Jun. 9, 2005

Related U.S. Application Data

(63) Continuation of application No. 10/198,503, filed on Jul. 17, 2002, now Pat. No. 6,933,808.

(51) Int. Cl.
H03H 9/00 (2006.01)

(52) U.S. Cl. .................. 333/193; 333/194; 333/195; 333/196; 330/313 R (58) Field of Classification Search ........ 333/150–154, 333/193–196; 310/313 R, 313 B, 313 C, 310/313 D
See application file for complete search history.

(56) References Cited

U.S. PATENT DOCUMENTS

| | | | |
|---|---|---|---|
| 3,999,153 A | 12/1976 | Borner | |
| 4,155,056 A | 5/1979 | Cross et al. | |
| 5,537,083 A | 7/1996 | Lin et al. | |
| 6,307,452 B1 | 10/2001 | Sun | |
| 6,391,675 B1 | 5/2002 | Ehmke et al. | |
| 6,393,913 B1 | 5/2002 | Dyck et al. | |
| 6,433,657 B1 | 8/2002 | Chen | |
| 6,492,884 B1 * | 12/2002 | Kosinski et al. | 333/166 |
| 6,516,665 B1 | 2/2003 | Varadan et al. | |
| 6,529,093 B2 | 3/2003 | Ma | |
| 6,686,820 B1 | 2/2004 | Ma et al. | |
| 6,933,808 B2 * | 8/2005 | Ma et al. | 333/193 |
| 2003/0006468 A1 * | 1/2003 | Ma et al. | 257/416 |
| 2003/0048036 A1 | 3/2003 | Lemkin | |

OTHER PUBLICATIONS

Liu, Yu, et al., "MEMS Capacitive Switch Design", http://my.ece.ucsb.edu/yorklab/Projects/MEMS/mems_cap_switch.html, (Jun. 2001).

Muldavin, Jeremy B., et al., "All-Metal High-Isolation Series and Series/Shunt MEMS Switches", *The IEEE Microwave and Wireless Components Letters*, Feb. 15, 2001, (Feb. 15, 2004), 1-3.

(Continued)

*Primary Examiner*—Khai M. Nguyen
(74) *Attorney, Agent, or Firm*—Schwegman, Lundberg, Woessner & Kluth, P.A.

(57) ABSTRACT

Microelectromechanical system (MEMS) apparatus and methods for surface acoustic wave (SAW) switching are disclosed. The apparatus includes a piezoelectric substrate having spaced apart input and output SAW transducers. A MEMS switch is arranged between the input and output SAW transducers The MEMS switch has a deformable member in electromagnetic communication with one or more actuation electrodes formed on or above the substrate. The deformable member is deformable to mechanically contact the substrate to deflect or absorb a SAW generated by the input SAW transducer.

37 Claims, 6 Drawing Sheets

OTHER PUBLICATIONS

Royer, Daniel, et al., *Elastic Waves in Solids II*, Springer-Verlag Berlin Heidelberg,(2000),pp. 253, 257, and 263.
Yao, Z. J., et al., "Micromachined Low-Loss Microwave Switches", *IEEE Journal of Microelectromechanical Systems*, vol. 8, No. 2, Jun. 1999, 129-134.

"International Preliminary Examination Report", (Jun. 3, 2005), 4 pgs.
"International Search Report for corresponding PCT Application No. PCT/US03/22105", (Oct. 15, 2003), 3 pgs.

* cited by examiner

MICROELECTROMECHANICAL APPARATUS AND METHODS FOR SURFACE ACOUSTIC WAVE SWITCHING

RELATED APPLICATION(S)

This application is a Continuation of U.S. application Ser. No. 10/198,503 filed Jul. 17, 2002 Now U.S. Pat. No. 6,933,808 which is incorporated herein by reference.

FIELD OF THE INVENTION

The field of the invention relates to microelectromechanical systems (MEMS), and in particular relates to MEMS apparatus and methods for surface acoustic wave (SAW) switching.

BACKGROUND OF THE INVENTION

Filters and switches are often used in combination in electronic devices. In cell phones for example, radio frequency (RF) signals are detected by an antenna, converted to electrical signals, and then processed. To process the signals, a switch is needed to switch the RF antenna to a filter on the receiving side of the device, or to a filter on the transmission side of the device. In addition, switches are needed to change between frequency channels. In most electronic devices, the switches are in the form of transistors. It is known in the art of electronics that electrical signals suffer from "insertion loss" from passing through switching and filter circuitry.

SAW devices are used in certain electronic applications as resonators and filters. In a SAW filter, an electrical signal is inputted to an input SAW transducer formed on a piezoelectric substrate. The input electrical signal typically has a relatively wide range of frequencies. However, the input SAW transducer creates a SAW having only a narrow range of frequencies. The SAW then travels over the substrate and is detected by an output SAW transducer. The output SAW transducer only responds to a narrow range of SAW frequencies, further enhancing signal filtering. The detected SAW is then converted to an output electrical signal, which has a narrower frequency range than the input electrical signal.

MEMS switches are also used in select electronic applications. One example of a MEMS switch is a capacitor shunt switch, which includes a top electrode in the form of a membrane, and a bottom electrode in the form of a transmission line. In operation, when a direct current (DC) actuation voltage is applied across the top electrode (membrane) and the bottom electrode (transmission line), the membrane is deflected to make physical contact with the dielectric layer of the transmission line. This shorts the circuit to ground, thereby cutting off transmission of signals traveling through the transmission line.

Presently, both MEMS and SAW devices are employed in a variety of electronic devices as resonators, filters and switches. Yet, the general approaches to switching and filtering using SAW and/or MEMS devices involve switching in the electrical domain and filtering in the acoustic domain. This approach tends to be inefficient because of the associated insertion losses. Unfortunately, alternative approaches are currently lacking because of the dearth of efficient acoustic-based switches.

DETAILED DESCRIPTION OF THE INVENTION

In the following detailed description of the embodiments of the invention, reference is made to the accompanying drawings that form a part hereof, and in which is shown by way of illustration specific embodiments in which the invention embodiments may be practiced. These embodiments are described in sufficient detail to enable those skilled in the art to practice them, and it is to be understood that other embodiments may be utilized and that changes may be made without departing from their scope. The following detailed description is, therefore, not to be taken in a limiting sense, and the scope of the embodiments of the present invention is defined only by the appended claims.

Figure 1:
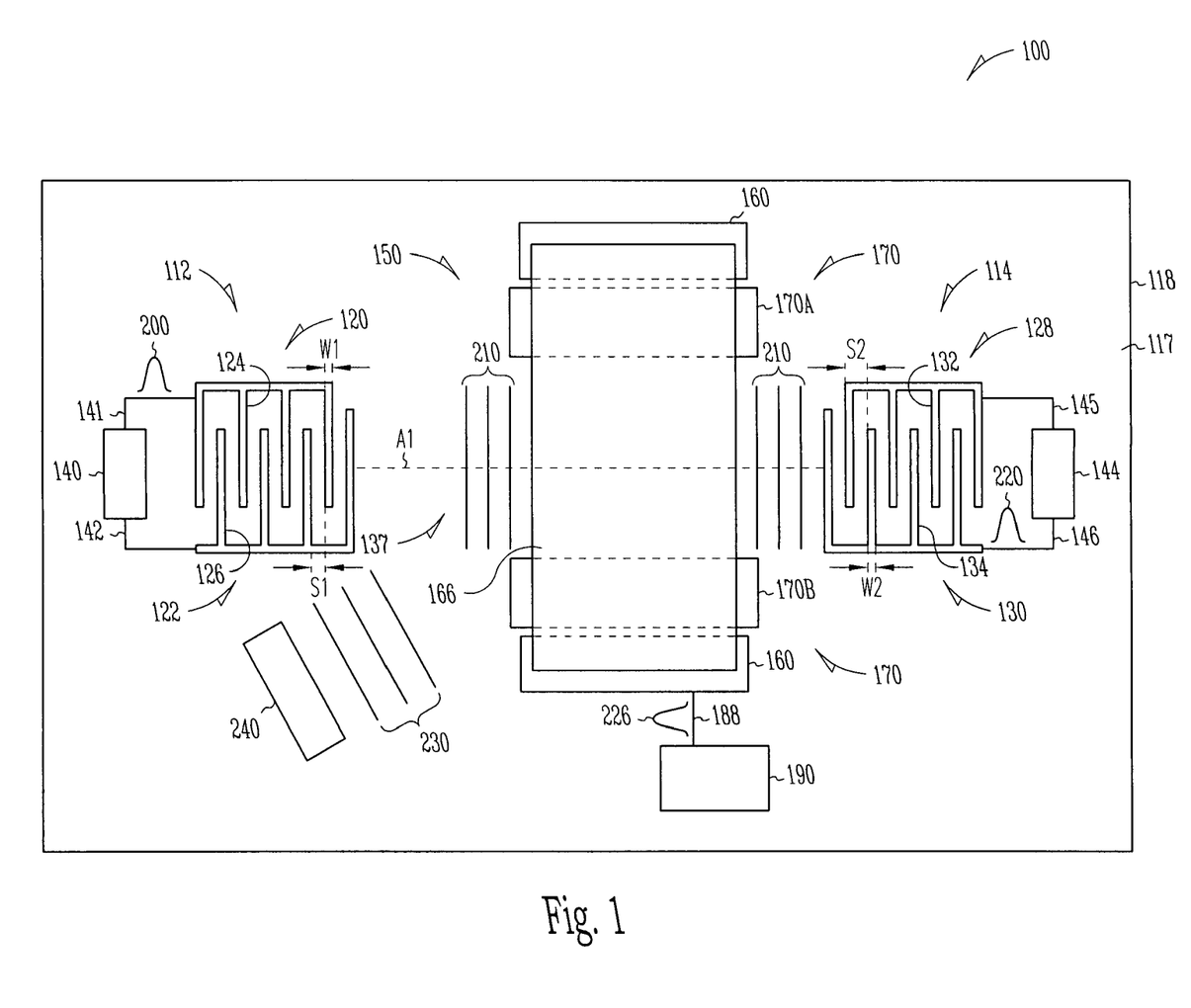
FIG. 1 is a schematic plan view of a generalized example embodiment of a MEMS switching apparatus having an actuation electrodes with two electrode members.

FIG. 1 is a schematic plan view of a generalized example embodiment of a MEMS switching apparatus 100. Apparatus 100 includes an input SAW transducer 112 and an output SAW transducer 114, each formed on or above an upper surface 117 of piezoelectric substrate 118. Input SAW transducer 112 includes first and second sets 120 and 122 of interdigitally arranged electrode fingers 124 and 126. Likewise, output SAW transducer 114 includes first and second sets 128 and 130 of interdigitally arranged electrode fingers 132 and 134.

In an example embodiment, electrode finger sets 120 and 122 are made of a metal film formed using photolithographic and thin film processes, which may include either etching or lift-off techniques. In an example embodiment of input SAW transducer 112, the width W1 of each electrode finger 124 and 126 and the spacing S1 between adjacent electrode fingers is on the micron or submicron level. Likewise in an example embodiment of output SAW transducer 114, the width W2 of each electrode finger 132 and 134 and the spacing S2 between adjacent electrode fingers is on the micron or submicron level.

Input and output SAW transducers 112 and 114 define a SAW path 137 over which a SAW travels. SAW path 137 is defined as the region of substrate surface 117 between the input and output SAW transducers. The width of SAW path 137 is substantially the same as the width of the SAW transducers, so that the SAW path is defined essentially by the size and spacing of the SAW transducers and covers the area between the SAW transducers.

An electrical signal (e.g., voltage) source 140 is coupled to electrode finger sets 120 and 122 of input SAW transducer 112 via wires 141 and 142, and serves to drive the input SAW transducer. In an example embodiment, electrical signal source 140 is an electronic element or device, such as an RF antenna or an amplifier. Further, an electronic element or device 144 is electrically coupled to electrode finger sets 128 and 130 of output SAW transducer 114 via wires 145 and 146. In an example embodiment, electronic element or device 144 is an amplifier (e.g., a low-noise amplifier), an electronic filter, or an analog signal processing chip. Alternatively, electronic device 144 includes some or all of these (or like) elements.

Apparatus 100 further includes a MEMS switch 150 formed on piezoelectric substrate 118 between input SAW transducer 112 and output SAW transducer 114. MEMS switch 150 includes anchors 160 connected to substrate 118 at upper surface 117. Anchors 160 support a deformable member 166 adapted to mechanically contact upper surface 117 within SAW path 137. In an example embodiment, deformable member 166 is a beam. In another example embodiment, deformable member 166 is a membrane.

MEMS switch 150 includes an actuation electrode 170 formed on substrate surface 117. Actuation electrode 170 is arranged so as to be in electromagnetic communication with deformable member 166. In particular, actuation electrode 170 is designed and arranged to electromagnetically engage deformable member 166 with sufficient strength to cause the deformable member to deform and contact substrate upper surface 117 when an electrical signal (e.g., a voltage signal) is applied to the actuation electrode.

Actuation electrode 170 can be made up of one or more electrode elements. For instance, in the example embodiment illustrated in FIG. 1, actuation electrode 170 is made up of two side actuation electrode elements 170A and 170B arranged on upper surface 117 beneath deformable member 166 and adjacent anchors 160. In an example embodiment, electrode elements 170A and 170B lie entirely outside of SAW path 137. In another example embodiment, the electrode elements making up electrode 170 lie at least partially outside of SAW path 137.

Figure 2:
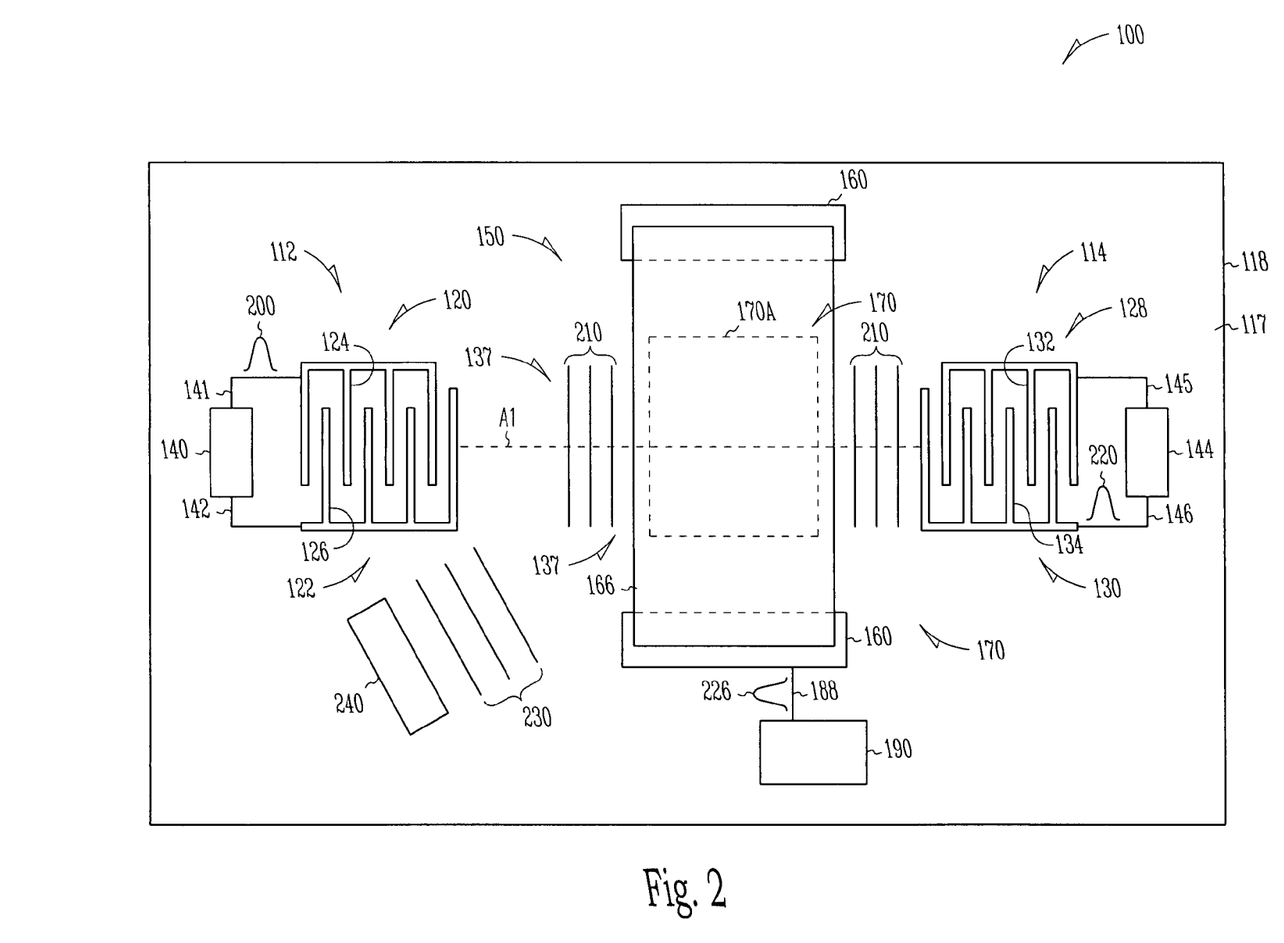
FIG. 2 is a schematic plan view of another generalized example embodiment of a MEMS switching apparatus similar to that of FIG. 1, except that the actuation electrode includes a single electrode member located beneath the deformable member.

In another example embodiment illustrated in FIG. 2, actuation electrode 170 of MEMS switch 150 includes a single electrode member 170A located on substrate upper surface 117 directly beneath deformable member 166 within SAW path 137. Actuation electrode member 170A is conductive, and in example embodiments includes a wear-resistant metal such as Cr, or includes an insulator such as doped diamond. To minimize the loss of SAW energy when passing over the actuation electrode, actuation electrode 170A should be relatively thin and uniform compared to the wavelength of the input SAW 210.

Coupled to MEMS switch 150 and to actuation electrode 170 via a wire 188 is an actuation electrical signal (e.g., voltage) source 190 that periodically actuates (i.e., activates or "turns on") the MEMS switch to deform deformable member 166 so that the deformable member is selectively mechanically contacted with and removed from a portion of substrate upper surface 117 within SAW path 137.

With continuing reference to FIG. 1, apparatus 100 operates as follows. Electrical signal source 140 applies an input electrical signal 200 between sets 120 and 122 of electrode fingers 124 and 126. This creates a periodic strain in piezoelectric substrate 118, thereby creating an input SAW 210 that travels over substrate surface 117 and within SAW path 137. The electrode finger width W1, electrode finger spacing S1, the interdigital pattern of the electrode fingers 124 and 126, and the frequency content of the applied input electrical signal 200 determines the magnitude and phase of input SAW 210. The input SAW propagates across upper surface 117 of substrate 118 to MEMS switch 150.

When MEMS switch 150 is in a first state, deformable member 166 is not in contact with substrate surface 117. This allows SAW 210 to propagate beneath the deformable member and through the MEMS switch without being disturbed. Input SAW 210 continues propagating along substrate surface 117 until it reaches output SAW transducer 114, where it is converted to an output electrical signal 220. Output electrical signal 220 is then further processed by electronic device 144.

When MEMS switch 150 is switched to a second state via an electrical signal 226 from electrical signal source 190, actuation electrode 170 electromagnetically engages and attracts deformable member 166. This causes the deformable member to deform and make contact with substrate upper surface 117. In one embodiment of apparatus 100, deformable member 166 deflects most of or substantially all of input SAW 210, thereby forming a deflected SAW 230. This deflection prevents most of or substantially all of input SAW 210 from reaching output SAW transducer 114.

Further in an example embodiment, deflected SAW 230 is optionally absorbed by an absorbing member 240 residing on or above substrate upper surface 117 and positioned to intercept the deflected SAW. Example materials for absorbing member 240 include silicone and silicone-based materials, such as RTV-3145 available from Dow-Corning, Inc.

In another example embodiment discussed in greater detail below, deformable member 166 includes an absorber layer that absorbs most of or substantially all of input SAW 210, thereby prevents input SAW 210 from reaching output SAW transducer 114.

The selective actuation of MEMS switch 150 causes deformable member 166 to interact with and modify the input SAW 210 in a manner that allows apparatus 100 to operate as an acoustic switch. Several specific example embodiments of the generalized example embodiment of apparatus 100 are now set forth in greater detail below.

MEMS Switch with Grating

Figure 3A:
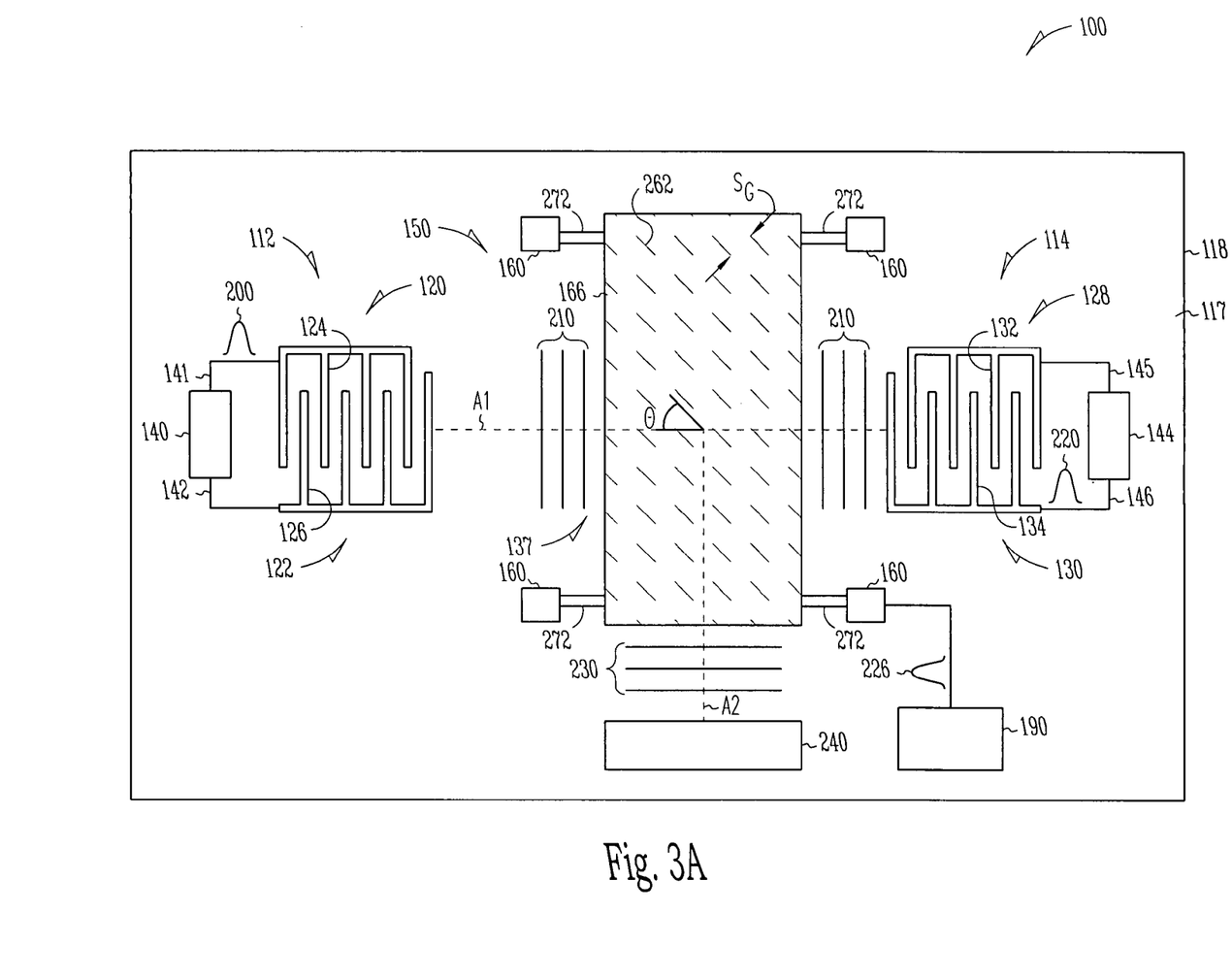
FIG. 3A is a schematic plan view of an example embodiment of the MEMS switching apparatus of FIG. 1, wherein the MEMS switch includes a deformable member with a grating layer.
Figure 3B:
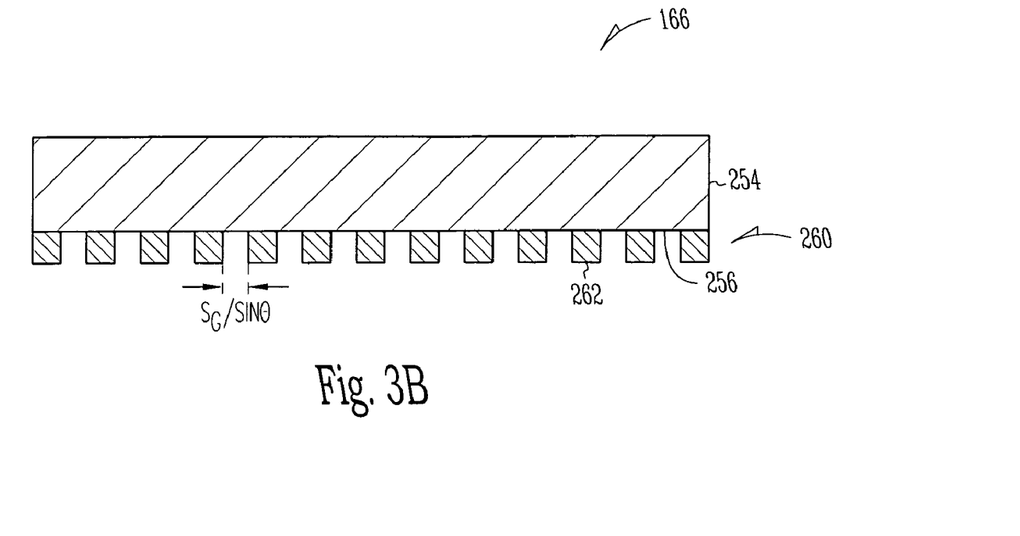
FIG. 3B is a cross-sectional view of the deformable member of the MEMS switch of FIG. 3A, illustrating in more detail the structural layer and the grating layer.

FIG. 3A is a schematic plan view of one example embodiment of the general example embodiment of the MEMS switching apparatus 100 of FIG. 1. FIG. 3B is a cross-sectional view of deformable member 166 of apparatus 100 of FIG. 3A. Deformable member 166 includes in the present example embodiment a structural layer 254 with a lower surface 256. Formed on lower surface 256 is a grating layer 260 having grating lines 262 with a grating spacing $S_G$. Both structural layer 254 and grating layer 260 can be made of a number of materials. In example embodiments, structural layer 254 includes a metal such as Ni, Au, Ti or Al, and grating layer 260 includes a metal, a metal-coated dielectric, nitride, carbide, or an oxide such as $SiO_2$.

In an example embodiment, grating layer 260 is oriented at an angle $\theta$ relative to axis A1. This results in input SAW 210 being deflected along an (imaginary) axis A2 that intersects axis A1. In an example embodiment, absorber 240 lies along axis A2 to intercept and absorb deflected SAW 230. In an example embodiment, orientation angle $\theta$ is such that the deflection of input SAW 210 occurs at a right angle, i.e., such that axes A1 and A2 are at 90 degrees.

The particular grating angle θ needed to achieve a particular deflection direction depends upon the velocities of the input and deflected SAWs 210 and 230. Consider $V_I$ the velocity of incident SAW 210 and $V_D$ the velocity of deflected SAW 230. The velocity $V_D$ may be different from $V_I$ due to anisotropy of piezoelectric crystal substrate 118. The pitch P of grating layer 260 is determined by $P=V_I \sin θ/f$, where f is the frequency of incident SAW 210. The condition for deflection at a right angle is given by $\tan θ=V_I/V_D$. Further in the example embodiment, the number of grating lines and the grating spacing $S_G$ are selected to maximally reflect incident SAW 210.

Figure 3C:
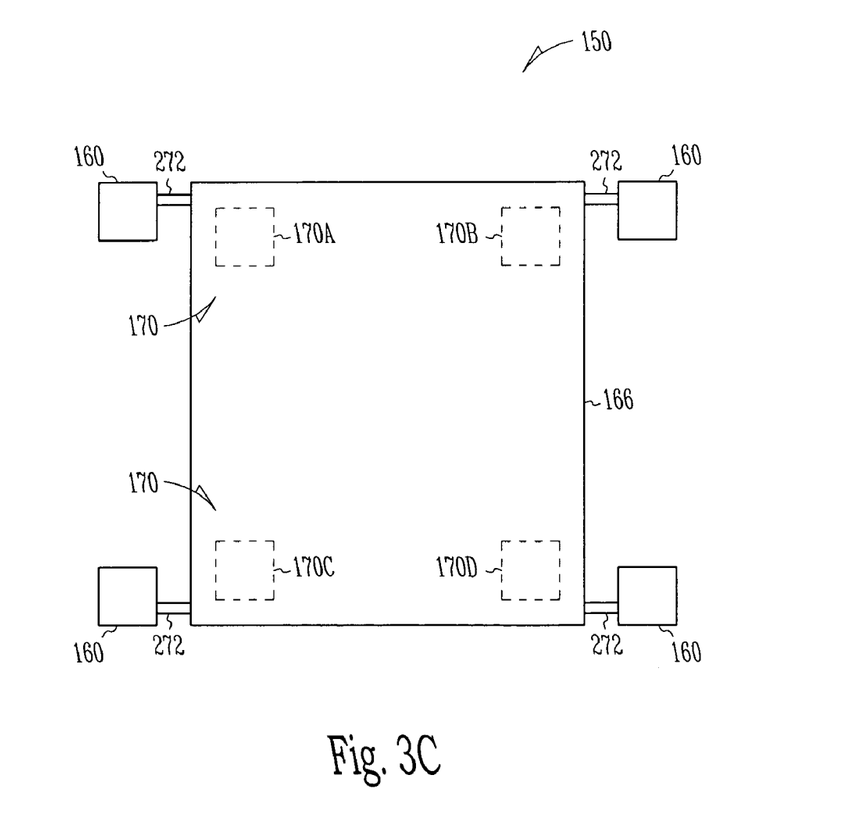
FIG. 3C is a close-up plan view of the MEMS switch of FIG. 3A, illustrating an example embodiment employing four actuation electrodes.

FIG. 3C is close-up plan view of the MEMS switch of FIG. 3A, which includes four anchors 160 with suspension members 272 attached thereto and connected to deformable member 166. In addition, actuation electrode 170 of MEMS switch includes four actuation electrode members 170A, 170B, 170C and 170D on substrate surface 117 arranged beneath deformable member 166 adjacent the deformable member's four corners. This arrangement allows for added flexibility of deformable member 166, while also providing space to accommodate multiple actuation electrodes.

In the operation of MEMS switching apparatus 100 of FIG. 3A, in a first state deformable member 166 is not in contact with substrate upper surface 117. This allows input SAW 210 to propagate directly to output SAW transducer 114. However, when MEMS switch 150 is switched to the second state via electrical signal 226 from actuation electrical signal source 190, actuation electrode members 170A, 170B, 170C and 170D electromagnetically engage deformable member 116, causing the deformable member to deform and make contact with substrate upper surface 117. This allows the grating layer of the deformable member to intercept and deflect most of or substantially all of input SAW 210.

In an example embodiment, deflected SAW 230 is optionally absorbed by absorbing member 240. This deflection and absorption provides the selective isolation of output SAW transducer 114 from input SAW transducer 112 necessary for carrying out a switching operation.

MEMS Switch with Absorber Layer

Figure 4A:
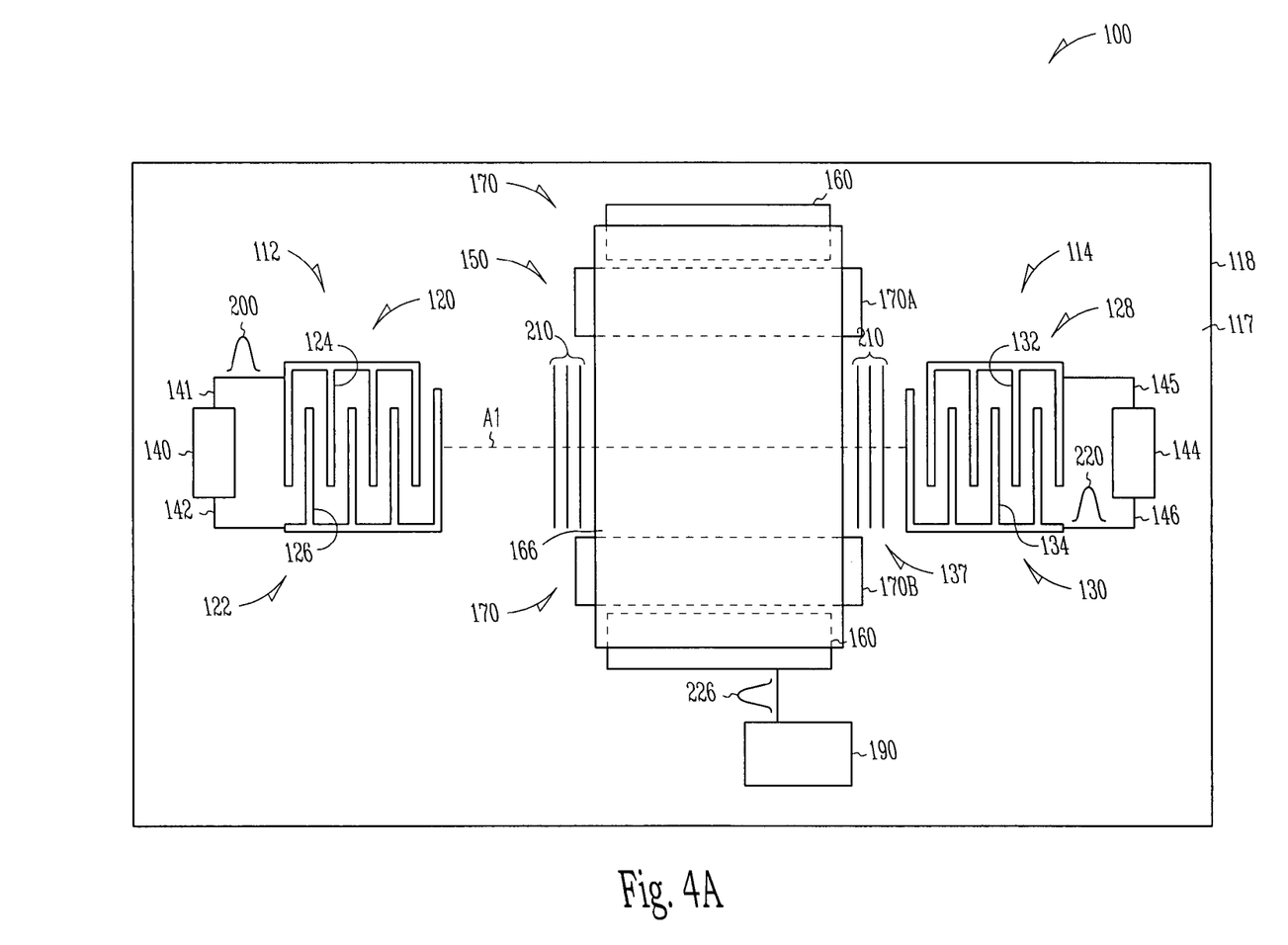
FIG. 4A is a schematic plan view of an example embodiment of the MEMS switching apparatus of FIG. 1, wherein the MEMS switch includes a deformable member with an absorber layer.
Figure 4B:
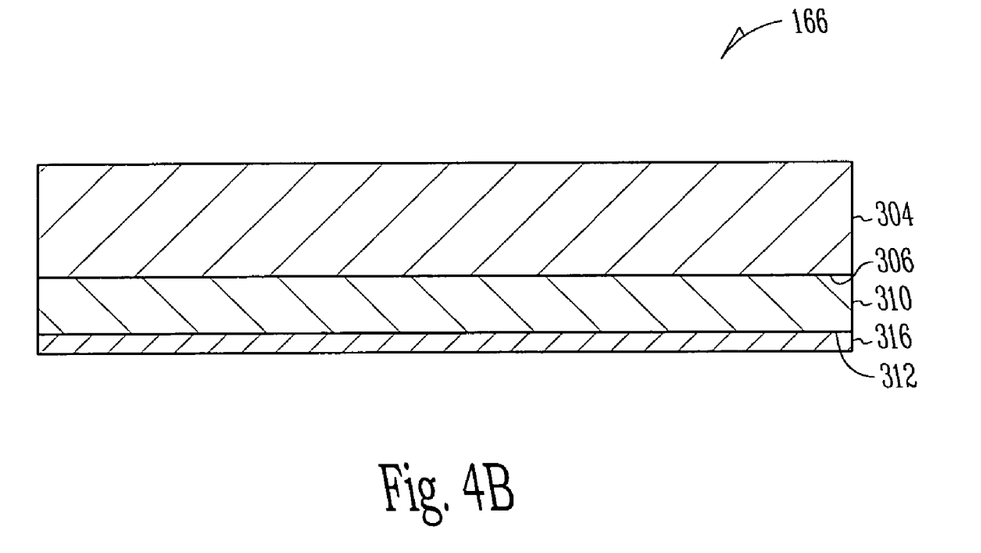
FIG. 4B is a cross-sectional view of the deformable member of the MEMS switch of FIG. 4A, illustrating in more detail the structural layer and the absorber layer.

FIG. 4A is a schematic plan view of another example embodiment of the generalized example MEMS switching apparatus 100 of FIG. 1. FIG. 4B is a close-up cross-sectional view of deformable member 166.

In apparatus 100 of FIG. 4A, deformable member 166 is membranous and includes a structural layer 304 with a lower surface 306, and an absorber layer 310 with a lower surface 312 formed on the structural layer lower surface. Absorber layer 310 is made of a material capable of absorbing a SAW. Example embodiments of absorber layer 310 include a polymer, or a soft metal.

In certain example embodiments, the material making up absorber layer 310 may be capable of damaging or contaminating substrate 118. In such a case, an optional example embodiment includes a thin liner layer 316 formed over lower surface 312 to protect upper surface 117 from damage or contamination from absorber layer 310. Thin liner layer 316 is made of a material compatible with the material making up substrate 118, and in an example embodiment includes the same material as that making up substrate 118.

Further in an example embodiment, substrate upper surface 117 includes an optional thin protective layer (not shown) to protect an underlying electrode or the piezoelectric substrate itself.

In the operation of MEMS switching apparatus 100 of FIG. 4A, when MEMS switch 150 is in the first state, deformable member 166 does not contact substrate surface 117. This allows input SAW 210 to propagate directly through MEMS switch 150 and to output SAW transducer 114. However, when MEMS switch 150 is actuated via electrical signal 226 from actuation electrical signal source 190, actuation electrodes 170A and 170B electromagnetically engage deformable member 166, causing it to deform and make mechanical contact with substrate upper surface 117. This allows deformable member 166 to intercept and absorb most of or substantially all of the input SAW in absorber layer 310. This absorption provides the selective isolation of output SAW transducer 114 from input SAW transducer 112 necessary for carrying out switching operation.

While the present invention has been described in connection with preferred embodiments, it will be understood that it is not so limited. On the contrary, it is intended to cover all alternatives, modifications and equivalents as may be included within the spirit and scope of the invention embodiments as defined in the appended claims.

What is claimed is:

1. A system comprising:
   a first circuit;
   an input surface acoustic wave (SAW) transducer on or above a piezoelectric substrate, the input SAW transducer coupled to the first circuit to receive an input signal and to generate an input SAW in the piezoelectric substrate from the input signal;
   an output SAW transducer on or above the piezoelectric substrate to receive the input SAW from the piezoelectric substrate and generate an output signal from the input SAW;
   a second circuit coupled to the output SAW transducer to receive and process the output signal; and
   a microelectromechanical system (MEMS) switch located between the input SAW transducer and the output SAW transducer, the MEMS switch having a deformable member to deform and mechanically contact the piezoelectric substrate to modify the input SAW generated by the input SAW transducer.

2. The system of claim 1 wherein the deformable member includes a grating layer to deflect the input SAW when the deformable member is in mechanical contact with the piezoelectric substrate.

3. The system of claim 1 wherein the deformable member includes an absorber layer to absorb most of the input SAW when the deformable member is in mechanical contact with the piezoelectric substrate.

4. The system of claim 1, further comprising an absorber located on or above the piezoelectric substrate to absorb most of a SAW deflected by the deformable member when the deformable member is in mechanical contact with the piezoelectric substrate.

5. The system of claim 1, further comprising an actuation electrode located on a surface of the piezoelectric substrate beneath the deformable member and along an axis connecting the input and output SAW transducers to electromagnetically engage the deformable member to cause the deformable member to deform with respect to the piezoelectric substrate.

6. The system of claim 1, further comprising two or more actuation electrode members arranged on a surface of the piezoelectric substrate beneath the deformable member to electromagnetically engage the deformable member to cause the deformable member to deform with respect to the piezoelectric substrate.

7. The system of claim 1 wherein:
the first circuit includes an RF antenna or an amplifier; and
the second circuit includes one or more of an amplifier, an low-noise amplifier, a filter, and a signal processing chip.

8. The system of claim 1, further comprising an electrical signal source coupled to an actuation electrode to generate an actuation electrical signal, the actuation electrode to electromagnetically engage the deformable member to cause the deformable member to deform with respect to the piezoelectric substrate in response to the actuation electrical signal.

9. The system of claim 1 wherein:
the input SAW transducer includes first and second sets of interdigitally arranged electrode fingers;
the output SAW transducer includes first and second sets of interdigitally arranged electrode fingers; and
the deformable member is a beam or a membrane; and further comprising:
a plurality of anchors connected to the piezoelectric substrate to support the deformable member; and
an absorber located on or above the piezoelectric substrate to absorb most of the input SAW or a SAW deflected by the deformable member, the absorber including a polymer, a soft metal, silicone, or a silicone-based material.

10. A system comprising:
a driver circuit coupled to an input surface acoustic wave (SAW) transducer to drive the input SAW transducer with an input signal, the input SAW transducer being located on or above a piezoelectric substrate to convert the input signal into an input SAW in the piezoelectric substrate;
a receiver circuit coupled to an output SAW transducer to receive and process an output signal from the output SAW transducer, the output SAW transducer being located on or above the piezoelectric substrate to receive the input SAW propagated from the input SAW transducer across a surface of the piezoelectric substrate and to convert the input SAW into the output signal; and
an actuation electrical signal source coupled to a microelectromechanical system (MEMS) switch located between the input SAW transducer and the output SAW transducer, the MEMS switch having a deformable member to deform and mechanically contact the piezoelectric substrate to modify the input SAW in response to a signal from the signal source.

11. The system of claim 10, further comprising an absorber located on or above the piezoelectric substrate to absorb most of a SAW deflected by the deformable member when the deformable member is in mechanical contact with the piezoelectric substrate.

12. The system of claim 10, further comprising one or more actuation electrode members arranged on a surface of the piezoelectric substrate beneath the deformable member to electromagnetically engage the deformable member to cause the deformable member to deform with respect to the piezoelectric substrate.

13. The system of claim 10 wherein the driver circuit includes an RF antenna or an amplifier.

14. The system of claim 10 wherein the receiver circuit includes one or more of an amplifier, an low-noise amplifier, a filter, and a signal processing chip.

15. A system comprising:
an input surface acoustic wave (SAW) transducer on or above a piezoelectric substrate, the input SAW transducer being coupled to receive an input signal and to generate an input SAW in the piezoelectric substrate from the input signal;
an output SAW transducer on or above the piezoelectric substrate to receive the input SAW from the piezoelectric substrate and to generate an output signal from the input SAW;
a low-noise amplifier coupled to the output SAW transducer to receive and amplify the output signal; and
a microelectromechanical system (MEMS) switch located between the input SAW transducer and the output SAW transducer, the MEMS switch having a deformable member to deform and mechanically contact the piezoelectric substrate to modify the input SAW generated by the input SAW transducer.

16. The system of claim 15, further comprising an absorber located on or above the piezoelectric substrate to absorb most of a SAW deflected by the deformable member when the deformable member is in mechanical contact with the piezoelectric substrate.

17. The system of claim 15, further comprising one or more actuation electrode members arranged on a surface of the piezoelectric substrate beneath the deformable member to electromagnetically engage the deformable member to cause the deformable member to deform with respect to the piezoelectric substrate, each actuation electrode member including a wear-resistant metal.

18. The system of claim 15, further comprising an RF antenna coupled to the input SAW transducer to receive an RF signal and to drive the input SAW transducer with the RF signal, the input SAW transducer to convert the RF signal into the input SAW.

19. The system of claim 15, further comprising an amplifier coupled to the input SAW transducer to amplify a signal and to drive the input SAW transducer with the amplified signal, the input SAW transducer to convert the amplified signal into the input SAW.

20. The system of claim 15, further comprising an electrical signal source coupled to an actuation electrode to generate an actuation electrical signal, the actuation electrode to electromagnetically engage the deformable member to cause the deformable member to deform with respect to the piezoelectric substrate in response to the actuation electrical signal.

21. The system of claim 15 wherein the deformable member includes a grating layer oriented at an angle $\theta$ to deflect the input SAW in a deflection direction when the deformable member is in mechanical contact with the piezoelectric substrate, the deformable member including a structural layer and a grating layer formed on a lower surface of the structural layer, the structural layer including Ni, Au, Ti or Al, and the grating layer including a metal, a metal-coated dielectric, nitride, carbide, an oxide, or SiO2.

22. A method comprising:
receiving a first signal;
converting the first signal into a first surface acoustic wave (SAW) in a piezoelectric substrate;
converting the first SAW in the piezoelectric substrate into a second signal;

processing the second signal; and controlling mechanical contact between a deformable member of a microelectromechanical system (MEMS) switch and the piezoelectric substrate to modify the first SAW before the first SAW is converted into the second signal.

23. The method of claim 22 wherein controlling includes deflecting the first SAW into a second SAW with a grating on the deformable member when the deformable member is in mechanical contact with the piezoelectric substrate.

24. The method of claim 23, further comprising absorbing the second SAW.

25. The method of claim 22, further comprising absorbing the first SAW when the deformable member is in mechanical contact with the piezoelectric substrate.

26. The method of claim 22 wherein controlling includes selectively coupling an electrical signal to an actuation electrode to electromagnetically engage and deform the deformable member such that the deformable member is selectively in mechanical contact with the piezoelectric substrate.

27. The method of claim 22 wherein converting the first signal includes converting the first signal into the first SAW in an input SAW transducer to propagate across a surface of the piezoelectric substrate in a SAW path defined between the input SAW transducer and an output SAW transducer, the deformable member being located proximate to the SAW path between the input SAW transducer and the output SAW transducer.

28. The method of claim 22 wherein converting the first SAW includes converting the first SAW in the piezoelectric substrate into a second signal when the deformable member is not in mechanical contact with the piezoelectric substrate.

29. The method of claim 22 wherein receiving a first signal includes receiving an RF signal from an RF antenna or receiving an amplified signal from an amplifier.

30. The method of claim 22 wherein processing the second signal includes amplifying the second signal in an amplifier or a low-noise amplifier or processing the second signal in a signal processing chip or filtering the second signal in a filter.

31. A method comprising:

receiving an RF signal from an RF antenna;

converting the RF signal into a first surface acoustic wave (SAW) in a piezoelectric substrate;

converting the first SAW in the piezoelectric substrate into a second signal;

processing the second signal; and controlling mechanical contact between a deformable member of a microelectromechanical system (MEMS) switch and the piezoelectric substrate to modify the first SAW before the first SAW is converted into the second signal.

32. The method of claim 31 wherein processing the second signal includes amplifying the second signal in an amplifier or processing the second signal in a signal processing chip or filtering the second signal in a filter.

33. The method of claim 32 wherein processing the second signal includes amplifying the second signal in a low-noise amplifier.

34. The method of claim 31 wherein controlling includes selectively coupling an electrical signal to an actuation electrode to electromagnetically engage and deform the deformable member such that the deformable member is selectively in mechanical contact with the piezoelectric substrate to absorb or deflect the first SAW.

35. A method comprising:

receiving an amplified signal from an amplifier;

converting the amplified signal into a first surface acoustic wave (SAW) in a piezoelectric substrate;

converting the first SAW in the piezoelectric substrate into a second signal;

processing the second signal; and controlling mechanical contact between a deformable member of a microelectromechanical system (MEMS) switch and the piezoelectric substrate to modify the first SAW before the first SAW is converted into the second signal.

36. The method of claim 35 wherein processing the second signal includes amplifying the second signal in an amplifier or a low-noise amplifier or processing the second signal in a signal processing chip or filtering the second signal in a filter.

37. The method of claim 35 wherein controlling includes selectively coupling an electrical signal to an actuation electrode to electromagnetically engage and deform the deformable member such that the deformable member is selectively in mechanical contact with the piezoelectric substrate to absorb or deflect the first SAW.

* * * * *

UNITED STATES PATENT AND TRADEMARK OFFICE
CERTIFICATE OF CORRECTION

| | |
|---|---|
| PATENT NO. | : 7,218,188 B2 |
| APPLICATION NO. | : 11/037307 |
| DATED | : May 15, 2007 |
| INVENTOR(S) | : Ma et al. |

It is certified that error appears in the above-identified patent and that said Letters Patent is hereby corrected as shown below:

On the Title page, item (57), under "Abstract", in column 2, line 6, after "transducers" insert -- . --.

Column 8, line 61, in Claim 21, delete "SiO2" and insert -- $SiO_2$ --, therefor.

Signed and Sealed this

Seventh Day of August, 2007

JON W. DUDAS
*Director of the United States Patent and Trademark Office*